United States Patent [19]

Hurwitt et al.

[11] Patent Number: 5,415,753

[45] Date of Patent: May 16, 1995

[54] STATIONARY APERTURE PLATE FOR REACTIVE SPUTTER DEPOSITION

[75] Inventors: Steven D. Hurwitt, Park Ridge, N.J.; Israel Wagner, Monsey, N.Y.

[73] Assignee: Materials Research Corporation, Orangeburg, N.Y.

[21] Appl. No.: 95,950

[22] Filed: Jul. 22, 1993

[51] Int. Cl.$^6$ ............................................. C23C 14/34
[52] U.S. Cl. ........................... 204/192.12; 204/298.07; 204/298.11
[58] Field of Search ............... 204/192.12, 298.11, 204/298.19, 298.07

[56] References Cited

U.S. PATENT DOCUMENTS

| | | | |
|---|---|---|---|
| 2,456,795 | 12/1948 | Samuelson | 204/298 |
| 3,410,774 | 11/1968 | Barson et al. | 204/192 |
| 3,594,301 | 7/1971 | Bruch | 204/298 |
| 3,617,463 | 11/1971 | Gregor et al. | 204/298 |
| 3,654,110 | 4/1972 | Kraus | 204/192 |
| 3,676,320 | 7/1972 | Christensen | 204/192 |
| 3,895,602 | 7/1975 | Bobenrieth | 118/49.1 |
| 4,147,573 | 4/1979 | Morimoto | 148/175 |
| 4,213,844 | 7/1980 | Morimoto et al. | 204/298 |
| 4,250,009 | 2/1981 | Cuomo et al. | 204/192 |
| 4,340,461 | 7/1982 | Hendrick et al. | 204/298 |
| 4,341,616 | 7/1982 | Nagatomo et al. | 204/298 |
| 4,350,578 | 9/1982 | Frieser et al. | 204/192 |
| 4,351,712 | 9/1982 | Cuomo et al. | 204/192 |
| 4,392,931 | 7/1983 | Maniv et al. | 204/192 R |
| 4,416,759 | 11/1983 | Harra et al. | 204/298 |
| 4,424,104 | 1/1984 | Harper et al. | 204/192 |
| 4,450,031 | 5/1984 | Ono et al. | 156/345 |
| 4,474,659 | 10/1984 | Fazlin | 204/192 |
| 4,481,062 | 11/1984 | Kaufman et al. | 156/345 |
| 4,508,612 | 4/1985 | Blackwell et al. | 204/298 |
| 4,540,466 | 9/1985 | Nishizawa | 156/643 |
| 4,604,179 | 8/1986 | Eltoukhy et al. | 204/298 |
| 4,637,853 | 1/1987 | Bumble et al. | 156/345 |
| 4,690,744 | 9/1987 | Naoe et al. | 204/192.11 |
| 4,704,306 | 11/1987 | Nakamura | 427/100 |
| 4,724,060 | 2/1988 | Sakata et al. | 204/298 |
| 4,767,641 | 8/1988 | Kieser et al. | 427/38 |
| 4,780,169 | 10/1988 | Stark et al. | 156/345 |
| 4,810,322 | 3/1989 | Gut et al. | 156/345 |
| 4,824,544 | 4/1989 | Mikalesen et al. | 204/298 |
| 4,854,265 | 8/1989 | Ohta et al. | 118/723 |
| 4,867,859 | 9/1989 | Harada et al. | 204/298 |
| 4,901,667 | 2/1990 | Suzuki et al. | 118/719 |
| 4,925,542 | 5/1990 | Kidd | 204/192.31 |
| 4,931,158 | 6/1990 | Bunshah et al. | 204/192.29 |

(List continued on next page.)

FOREIGN PATENT DOCUMENTS

| | | |
|---|---|---|
| 0154859 | 9/1985 | European Pat. Off. . |
| 0067016 | 4/1983 | Japan ............ 204/298.11 |
| 0000577 | 1/1986 | Japan ............ 204/298.11 |
| 61-243167 | 10/1986 | Japan . |

(List continued on next page.)

Primary Examiner—Nam Nguyen
Attorney, Agent, or Firm—Wood, Herron & Evans

[57] ABSTRACT

The aperture plate of the present invention is positioned between a sputter target and a substrate to be coated with a film of target material. The substantially non-collimating plate contains a plurality of apertures which intercept a percentage of the sputter particles while allowing other sputter particles to be deposited upon the substrate to form the film. The rate of deposition achieved by the aperture plate is less than the rate of sputtering so that the target may be sputtered at a sufficiently higher rate to reduce the formation of a reactant film on the sputter target while the deposition rate is sufficiently low to allow adequate reaction between a reactive gas and sputter particles to form the desired reactant film on the substrate. In accordance with another aspect of the invention, the apertures of the plate have different aspect ratios or different densities in various different regions of the plate to achieve various different deposition rates in different areas of the substrate. The aspect ratios of the apertures may be selectively varied to achieve a more uniform film thickness or a film of selectively varied thicknesses. The various aspect ratios are achieved by selectively varying a cross-sectional area and/or depth of the apertures in the plate.

11 Claims, 1 Drawing Sheet

U.S. PATENT DOCUMENTS

| | | | |
|---|---|---|---|
| 4,971,653 | 11/1990 | Powell et al. | 156/626 |
| 4,981,568 | 1/1991 | Taranko et al. | 204/192.31 |
| 4,988,424 | 1/1991 | Woodward et al. | 204/192.29 |
| 4,992,153 | 2/1991 | Bergmann et al. | 204/192.16 |
| 4,999,320 | 3/1991 | Douglas | 437/225 |
| 5,006,220 | 4/1991 | Hijikata et al. | 204/298.3 |
| 5,008,002 | 4/1991 | Uno et al. | 204/192.31 |
| 5,058,527 | 10/1991 | Ohta et al. | 118/723 |
| 5,099,100 | 3/1992 | Bersin et al. | 219/121.4 |
| 5,112,466 | 5/1992 | Ohta et al. | 204/298.05 |
| 5,114,559 | 5/1992 | Ohta et al. | 204/298.05 |
| 5,223,108 | 6/1993 | Hurwitt | 204/298.11 X |

FOREIGN PATENT DOCUMENTS

| | | |
|---|---|---|
| 62-7855 | 1/1987 | Japan . |
| 62-17173 | 1/1987 | Japan . |
| 63-310965 | 12/1988 | Japan . |
| 1051251 | 12/1966 | United Kingdom . |

STATIONARY APERTURE PLATE FOR REACTIVE SPUTTER DEPOSITION

FIELD OF THE INVENTION

The present invention relates to sputter deposition and, more specifically, to reactive sputter deposition used to coat a substrate with a film that is a combination of the target material and a reactive gas.

BACKGROUND OF THE INVENTION

Sputter deposition is a generally known method of depositing a layer of material onto the surface of a substrate workpiece, such as a semiconductor wafer. In sputter deposition, a substrate to be coated is placed generally opposite a sputter target of the material to be deposited and an ionized gas plasma is formed in the area of the target. The target is electrically energized with a negative electrical polarity opposite the polarity of the ionized gas particles in the plasma, while the deposition chamber or enclosure is grounded so as to create an electric field at the target. The ionized plasma atoms under the influence of the electric field, bombard the target surface and dislodge or "sputter" particles of target material which travel away from the target. Since the substrate is usually positioned opposite the target, the sputtered particles deposit on the substrate to form a deposition film layer of the target material on the substrate.

Reactive sputter deposition is a form of sputter deposition which occurs in the presence of a chemically reactive gas, such as nitrogen or oxygen, in addition to an inert gas, such as argon, which is used to form the ionized plasma. The plasma produces the ions that sputter the target ejecting particles that project onto the substrate. As the target particles are deposited on the substrate, they come into contact and react with the reactive gas at the surface of the substrate causing a film to form on the substrate surface that is a product of the chemical reaction. Therefore, in reactive sputter deposition, the composition of the deposited film is a chemical combination of both the target material and the reactive gas. For example, sputtering an aluminum target in the presence of inert argon gas will yield an aluminum film on the substrate. Alternatively, when particles are reactively sputtered from an aluminum target in the presence of an argon-oxygen gas combination, the film deposited on the substrate is the ceramic aluminum oxide. Similarly, targets sputtered in the presence of other reactive gas combinations will yield various other reactant films on the substrate.

A recurring problem with reactive sputtering is that the chemical reaction between the reactive gas and the target particles takes place not only at the surface of the substrate but also at the sputtering surface of the target. As a result, an undesired reactant film forms on the target. This problem is particularly troublesome when the reactant film that is formed is an electrically insulating material, such as, for example, the ceramic aluminum oxide. When an insulating reactant film is formed on the surface of the target, it causes plasma instabilities, electrical arcing, and the generation of contaminating particles in the sputter deposition chamber. These results are undesirable in a sputter deposition chamber and adversely affect the proper deposition of a film on a substrate.

It has been proposed to provide a primarily inert gas such as argon in the area of the target and to provide a primarily reactive gas such as oxygen in the area of the substrate. While this method may be effective to prevent reactant layers from forming on the target, the method requires that the distance between the sputter target and the substrate be increased in order to reduce the tendency of the inert gas and the reactive gas to intermix and in order to physically isolate the target from the reactive gas. When the distance is increased, however, the deposition rate is reduced and the thickness uniformity of the film deposited on the surface of the substrate is also reduced. Uniform thickness of the deposition film is often a desirable quality in both reactive and non-reactive sputter deposition processes.

Another way of reducing the formation of a reactant film on the surface of the target, is to bias the target such that it is sputtered away at a rapid rate that is faster than the reaction rate of the reactive gas with the target. Rapidly sputtering the target yields a clean target surface and prevents the formation of a reactant layer on the target. However, when the rate of sputtering is increased, the rate of deposition on the substrate is also increased. At an increased deposition rate, the sputter particles do not have time to sufficiently react with the reactive gas at the surface of the substrate, and the desired reactant film is not formed. It has also been proposed to rapidly sputter the target and increase the concentration of reactive gas at the substrate surface. However, an increased concentration of gas requires the introduction and evacuation of gas at a rate that may not be possible without the use of an increased number of pumps or larger pumps, both of which result in a greater processing expense and complexity. Further, certain properties of the deposited film such as the resistivity of the film and its morphology or crystalline nature are adversely affected by a rapid deposition rate despite the presence of higher concentrations of reactive gas.

Another drawback in sputter deposition is the non-uniformity of the film that is deposited upon the substrate. The uniformity of the film thickness is a function of many factors, including the relative ion concentration and the shape of the gas plasma which sputters the target, such as that which results from the shape of the magnetic fields which may be used to enhance the plasma formation over the target. Other factors include the shape of the vacuum chamber containing the substrate, the spatial effects of any other structures or devices located within the chamber proximate the target and the substrate, as well as any external or internal electric or magnetic field effects associated with sputter deposition chamber. The shape of the target and its orientation with respect to the substrate may also result in a non-uniform film.

It is, therefore, an objective of the present invention to reduce the formation of a reactant film on the surface of the sputter target while providing the proper reaction conditions at the substrate surface for the deposition of the desired reactive material film on the substrate. It is a further objective of the present invention to provide a means for selectively controlling the rate of deposition on a substrate and selectively varying the thickness of a deposited film, such as to improve the uniformity of the thickness of a sputter deposited film.

SUMMARY OF THE INVENTION

The present invention accomplishes these and other objectives by providing a stationary aperture plate which is mounted between and generally parallel to the sputter target and a substrate upon which a reactant material film is to be deposited. The stationary aperture plate includes a plurality of low aspect ratio apertures formed therein which have walls oriented generally perpendicularly to the target and substrate to intercept some of the sputter particles traveling from the target. Other sputter particles that are not intercepted by the plate pass through the plate and deposit themselves upon a surface of the substrate. The rate of sputtering from the target is therefore higher than the deposition rate due to the interception of the particles by the plate. By mounting the aperture plate between the target and the substrate and varying the cross-sectional area and/or depth of the apertures, the rate of sputtering from the target may be kept sufficiently higher than the reaction rate of the reactive gas with the target so as to prevent the formation of a reactant film on the substrate surface while providing the desired film on the substrate.

The apertures of the plate of the present invention have low aspect ratios, such that when placed between the sputter target and the substrate, the plate is generally non-collimating. Therefore, the sputter particles are generally not focused into columns or beams of particles, but rather are distributed at random flight paths onto the substrate surface. Further, the plate is spaced a sufficient distance from the substrate, preferably 0.5 to 1 inch, such that the plate is virtually shadowless. In this way, there is no masking of apertures of the plate onto the substrate surface.

Due to the plate and the effect of the apertures, the deposition rate is maintained sufficiently low to allow complete reaction between the sputter particles and the reactive gas at the substrate surface. In effect, the stationary aperture plate creates and maintains a difference between the sputter rate and the deposition rate in order to prevent the formation of a reactant film on the target. Using the aperture plate, therefore, the target is sputtered away at a sufficiently high rate, keeping the target surface clean and free from the formation of a reactant film layer, while at the same time the deposition on the substrate is maintained sufficiently low to provide for complete chemical reaction as desired between the sputter particles and the reactive gas at the substrate surface.

In accordance with another feature of the aperture plate of the preferred embodiment of the present invention, the cross-sectional area, depth and density of apertures of the plate may be selectively varied across the plate to achieve different deposition rates at different areas on the substrate. For example, the apertures might be varied in cross-sectional area, depth and/or density to provide different deposition rates at different radii outwardly from the center of a circular substrate such as a traditional semiconductor wafer. The variation in deposition rates achieved by the aperture plate is a function of the cross-sectional area, depth and density of the apertures on the plate. Therefore, in the plate of the present invention, the apertures are increased or decreased in cross-sectional area, or alternatively, increased or decreased in depth such as by changing the thickness of the plate in different areas, to achieve the desired deposition rates on different areas of the substrate.

The dimensions of the apertures and their density determine the percentage of sputter particles that are intercepted by the plate, and the extent to which they are varied across the plate determines the effective variation in deposition rate that is achieved at different areas across the substrate or wafer. Therefore, using selective variation of the aperture dimensions and/or density, the deposition rates may be made selectively higher in some areas of the substrate relative to other areas on the substrate. By varying the deposition rates achieved by different areas of the plate, the thickness of the deposited material film is controlled across the substrate surface. Such variation may be used to compensate for the shape of the plasma or other electrical or geometrical factors, thereby producing a uniform or other desired distribution of sputtered material and film thickness across the substrate surface. The plate having apertures of varied cross-sectional area and depth, also preferably has apertures of a low aspect ratio such that they are generally non-collimating. Further, the plate is preferably spaced a sufficient distance, at least approximately 0.5 inches, from the substrate so as not to leave a mask pattern of the aperture plate in the film layer deposited on the substrate. If collimation is desired, the aspect ratios of the plate might be adjusted to accomplish collimating as long as the varied deposition rates at the different areas of the substrate are also accomplished in accordance with this one feature of the present invention.

For example, in one embodiment of the invention, apertures of larger cross-sectional area around the periphery of the aperture plate than at its center will provide a greater deposition efficiency at the center of the substrate relative to the substrate edges. This, in turn, may cause a greater film thickness at the edge of the substrate than at the substrate center, or the higher deposition rate may be necessary to compensate for the common tendency of the deposition rate of sputter deposition to be greater at the substrate center. The same result of an increased deposition rate of the periphery of the substrate might be achieved in another embodiment of the invention by making the apertures shallower in depth at the periphery of the plate than at its center. When the apertures are made shallower, such as by reducing the thickness of the plate in certain areas, the wall depth of the aperture is shortened, and the probability that a sputter particle will strike a wall and deposit thereon is reduced. Reducing the probability of capturing sputter particles with a particular aperture increases the probability that a sputter particle will be deposited beneath that aperture on the substrate. Therefore, a shallower aperture means a higher deposition rate beneath that aperture than beneath a deeper aperture. Alternatively, in other embodiments of the present invention, the aperture cross-section might be made larger and/or the aperture shallower at the center of the plate to provide a greater deposition rate at the center relative to the periphery of the substrate. In this way, the aperture plate of the present invention is used to selectively vary the deposition rates in different areas of the substrate to achieve either a generally uniform film thickness on the plate, or to achieve a film of selected, varying thickness across the substrate.

Therefore, the aperture plate of the present invention reduces the formation of a reactant film layer on the target surface while allowing sufficient chemical reaction at the substrate surface. Furthermore, the aperture plate of the present invention provides selective variation of the deposition rate across the surface of the substrate to achieve variable film thicknesses or a more uniform film thickness on a substrate, as desired. These and other objectives will become more readily apparent in the detailed description of the aperture plate of the present invention given hereinbelow.

DETAILED DESCRIPTION OF THE INVENTION

Figure 1:
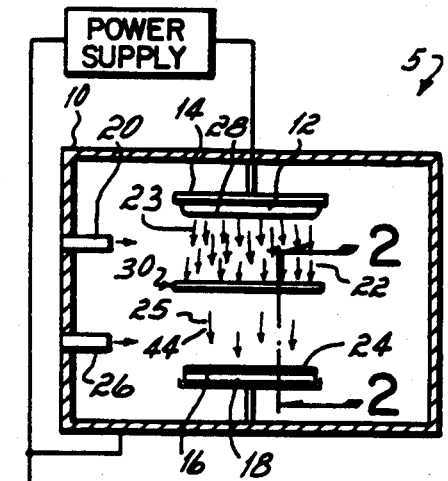
FIG. 1 is a front elevational view, in cross-section, of a reactive sputter deposition chamber showing use of the stationary aperture plate of the present invention.

Referring to FIG. 1, a reactive sputter deposition chamber 5 includes a vacuum housing 10 containing a sputter target 12 mounted to a mounting structure 14 and a substrate workpiece or wafer 16 mounted to a support 18 generally opposite the target 12. An ionizable inert gas, such as argon, is introduced into the housing 10 in the proximity of the target 12 through a gas inlet, such as nozzle 20. Inside the housing 10, the ionizable gas is ionized into a gas plasma which contains positively ionized gas atoms. The gas may be ionized into a plasma through any of the commonly acceptable methods. For example, by energizing the target 12 negatively through power source 11 with respect to housing 10, electrons are emitted from the target 12. The electrons strike and ionize some of the inert gas particles to create positively ionized plasma atoms. The positively ionized plasma atoms of the gas plasma are then attracted to cathode target 12 under the influence of an electric field, and the positive gas ions bombard the target 12 to dislodge or "sputter" the target particles 22 from the target 12.

As seen in FIG. 1, the dislodged target particles 22 travel away from target 12 and assume various flight paths, as indicated by the arrow 23. The particles 22 predominately travel generally perpendicular to the bottom target surface 28; however, various other flight directions are also assumed by the particles 22. Preferably a majority of the sputter particles 22 travel in a vertically downward direction as shown in FIG. 1, or in a direction generally perpendicular to the planar surface 24 of substrate 16 so that a large percentage of the particles 22 are deposited upon surface 24 of substrate 16 to form a film 27 on the substrate surface 24.

In reactive sputter deposition, a reactive gas such as oxygen or nitrogen is introduced into the housing 10 in proximity to the substrate 16 through appropriate means, such as a nozzle 26. The reactive gas (not shown) reacts with the sputter particles 25 which deposit on the substrate surface 24, and the gas chemically alters the particles 25 to yield a film layer 27 on surface 24 which is a chemical combination of the target material and the reactive gas (see FIG. 2). For example, utilizing a cathode target 12 consisting of aluminum, the sputter particles 22 are aluminum, and in the absence of a reactive gas, a film of aluminum is deposited upon substrate 16. However, when a reactive gas, such as oxygen, is introduced into housing 10, a layer of the ceramic aluminum oxide is formed on substrate surface 24. While aluminum is a conductor, aluminum oxide has insulating properties, and thus presents a film that has significantly different electrical properties than aluminum.

While a reactant film 27 at the substrate surface 24 is desirable, the reactive gas used in reactive sputter deposition often creates undesirable results at the surface 28 of target 12. When the reactive gas mixes with the inert gas in the proximity of target 12, the chemical reaction between the sputter particles and the reactive gas does not occur only at the substrate surface 24, but also occurs on the surface 28 of sputter target 12. As a result, an undesired reactant film is formed at target surface 28. This is a particularly troublesome problem when the reactant layer formed on target surface 28 is an electrical insulator, such as aluminum oxide, because an insulating layer on the target surface 28 causes undesirable results such as plasma instabilities, electrical arcing, and the generation of contaminating particles in the deposition chamber 5, in addition to other undesirable results.

Figure 2:
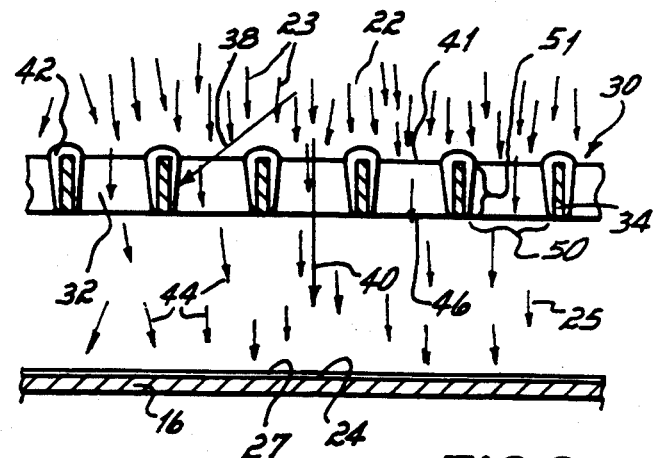
FIG. 2 is a diagrammatic cross-sectional view along lines 2—2 of FIG. 1 of the stationary aperture plate and substrate.

To reduce the formation of a reactant film on target 12, a stationary aperture plate 30 in accordance with the principles of the present invention is positioned in housing 10 generally between target 12 and substrate 16. FIG. 2 shows an enlarged diagrammatic cross-sectional view of a region of the stationary aperture plate 30. Aperture plate 30 has a plurality of openings or apertures 32 extending through the plate. The apertures 32 are defined by opposing aperture walls 34 as discussed hereinabove. When particles of target material 22 are sputtered from target 12, they assume various flight paths away from target 12 as indicated by arrows 23. Generally, a large percentage of the sputter particles travel toward substrate 16 and, if unhindered, will strike the exposed surface 24 of substrate 16 to form film 27. However, using plate 30 of the present invention, some of the sputter particles, such as those particles having a flight path similar to arrow 38, impact with an aperture wall 34 and will be deposited thereon instead of substrate 16. Other sputter particles, such as those having a path similar to arrow 40, pass through the apertures 32, avoiding walls 34, and are deposited upon substrate surface 24. The accumulation of sputter particles 22 intercepted by the walls 34 of aperture plate 30 is indicated by reference numeral 42.

As may be seen in FIG. 2, the interception of sputter particles 22 by the walls 34 of aperture plate 30 reduces the number of sputter particles 25 which make it past the aperture plate 30 to be deposited on substrate surface 24. That is, the number of particles 22 incident upon the top plane 41 of plate 30 is greater than the number of particles 25 which pass through the bottom plane 46 of the plate 30 to deposit on substrate 16. The sputter rate is defined as the number of particles that are sputtered from target 12 per unit time, while the deposition rate is defined as the number of sputtered particles which deposit on the upper exposed surface 24 of substrate 16 per unit time. By intercepting a percentage of sputter particles 22, aperture plate 30 makes the effective deposition rate on substrate surface 24 less than the sputter rate of the target 12. For example, in FIG. 2, the rate of production of sputter particles 22 from target 12, i.e., the sputter rate, is indicated by the relatively large number of arrows 23 that are incident on the top plane 41 of the plate 30 compared with the smaller number of arrows 44 which pass through the plate 30 and through the bottom plane 46 of the plate 30. Since a percentage of sputter particles 22 are intercepted by the aperture walls 34 of plate 30, the number of sputter particles 25 deposited on substrate surface 24 per second, i.e., the deposition rate, is less than the sputter rate as illustrated by the smaller number of arrows 44 on the bottom side of plate 30.

The apertures 32 of plate 30 have relatively low aspect ratios. As will be further defined below, high aspect ratio apertures intercept a large percentage of sputter particles and focus the sputter particles into generally highly defined columns or beams of sputter particles. Such focusing by high aspect ratio apertures is referred to as collimation. With low aspect ratio apertures, the aperture plate 30 of the present invention is substantially non-collimating. That is, the apertures 32 of the plate 30 do not substantially focus or collimate the incident sputter particles 22 into focused beams or columns by eliminating all particles 22 incident to the plate 30 except those having a generally perpendicular flight path with respect to the plate 30 and substrate 16. The substantially non-collimating plate 30 generally intercepts only a relatively small percentage of sputter particles. Utilizing low aspect ratio apertures, the rate reduction between the sputter rate and the deposition rate achieved by plate 30 is between approximately 20 and 40 percent, and preferably between 25 and 35 percent. That is, using the plate 30 of the present invention, the deposition rate is generally only 25 to 35 percent less than the sputter rate. Commercial collimators, on the other hand, with high aspect ratio apertures, achieve a reduction in the rate of deposition from the rate of sputtering in the range of approximately 90 to 95 percent. Such a rate reduction is undesirable due to the waste of deposition material and the increased amount of time associated with depositing a film 27 of predetermined thickness on the substrate 16.

Further, plate 30 is spaced from the substrate 16 a sufficient distance so that there is no sharp delineation of the aperture pattern on the surface of substrate 16. That is, plate 30 is virtually shadowless. In this way, the plate 30 does not mask the apertures onto the substrate 16 to produce a film layer which reflects the aperture pattern, but rather provides sufficiently equal deposition rates across the substrate surface 24 to achieve a generally uniformly thick layer on substrate 16 as may be desired. Preferably, the plate 30 is spaced from the substrate 16 approximately 0.5 to 1 inch, or more, to reduce or eliminate any masking or shadowing effects that may occur on substrate surface 24.

Therefore, using aperture plate 30, the target 12 may be sputtered away at a first rate, but the effective deposition rate on substrate 16 which is achieved below plate 30 is at a second rate which is less than the sputter rate or first rate. Using plate 30, the target 12 may be sputtered away at a rate that is greater than the rate of reaction between the reactive gas and the target 12 so that the target surface 28 remains "clean" and free from the formation of a reactant film on the target 12. Since the deposition rate, or second rate, is less than the sputter rate, there is a sufficient amount of time for the particles on the surface 24 of substrate 16 to react with the reactive gas and form reactant film 27, despite the relatively high sputter rate.

As such, the desirable reaction between the deposited particles 25 and the reactive gas may be achieved without the necessity of boosting the concentration of reactive gas in proximity to substrate 16, thus eliminating the need for an increased number of larger pumps for evacuating the gas. Reactive sputter deposition is achieved using plate 30 without the undesired formation of a reactant layer on the target which may cause plasma instabilities, electrical arcing and the generation of contaminants in the sputter deposition chamber. Further, since the plate 30 is substantially non-collimating, there is not a lot of waste of sputter material that occurs due to the plate, and a layer may be deposited on substrate 16 quickly and more efficiently.

Since the dimensions of the apertures 32 of plate 30 affect the overall variation between the sputter rate and the deposition rate, the aperture dimensions of the apertures 32 of plate 30 may be tailored to achieve the desired reductions in deposition rate required in accordance with the principles of the present invention as just described. Referring again to FIG. 2, the dimensions of the apertures 32 determine the number or percentage of sputter particles 22 which pass through the aperture 32 and are deposited on substrate 16. Both the cross-sectional area of aperture 32, as indicated by reference numeral 50, and the depth, as indicated by reference numeral 51, determine the percentage of incident sputter particles 22 which pass through plate 30 and are deposited on substrate surface 27 as indicated by arrows 44 below the bottom plane 46 of plate 30. More specifically, the ratio of the depth 51 of aperture 32 to the cross-sectional area 50 of the aperture determines the percentage of incident sputter particles 22 which pass through plate 30.

The ratio of aperture depth 51 to aperture cross-sectional area 50 is sometimes referred to as the "aspect ratio". Referring to aperture plate 30 of the present invention shown having generally circular apertures, an aspect ratio of 1 corresponds to those apertures which have the same depth 51 as diameter 50. While circular apertures are used in a preferred embodiment of the plate of the present invention, other shapes may be used for the apertures, such as rectangular, hexagonal or octagonal. As may be appreciated, another cross-sectional dimension would be used rather than diameter to define the aspect ratio for these other shaped apertures. In a preferred embodiment of aperature plate 30, the aspect ratios of the apertures 32 are generally in the range from 0.05 to 0.5, which correspond to aperture depth to diameter ratios of 1:20 and 1:2, respectively.

With such relatively low aspect ratio apertures, the plate 30 of the present invention is substantially non-collimating as discussed above. In this way, the sputter deposition is maintained generally non-focused over the area of the substrate. Further, due to its substantially non-collimating nature, the plate 30 sufficiently reduces the deposition rate from the sputter rate in order to provide a clean target surface in accordance with one of the objectives of the present invention without blocking too large a percentage of the sputter material from the substrate. Therefore, the substrate may be coated with a film at a sufficient rate to have desirable substrate throughput in the deposition chamber, despite the reduction in the sputter rate to reduce and/or eliminate the undesirable target reactant film.

In reactive sputter deposition and other sputter deposition applications, the uniformity of the film 27 deposited upon the exposed surface 24 of the substrate 16 is often an important parameter. Non-uniform thickness of a layer deposited upon a substrate may reduce the yield of devices from the substrate and may also degrade the operation of the electrical devices which are yielded from the substrate. In accordance with another aspect of the present invention, the aperture plate includes apertures of selectively varied cross-sectional areas and depth and various different aspect ratios in selected areas of the plate, as well as different aperture densities in select, ed areas of the plate. The selectively varied aperture dimensions and densities on the plate act to selectively vary the deposition rate in selected areas of the substrate. In this way, the deposition rates may be selectively varied to achieve, for example, a more uniform thickness of the film deposited on the substrate or to achieve a film having different thicknesses across the substrate.

Figure 3:
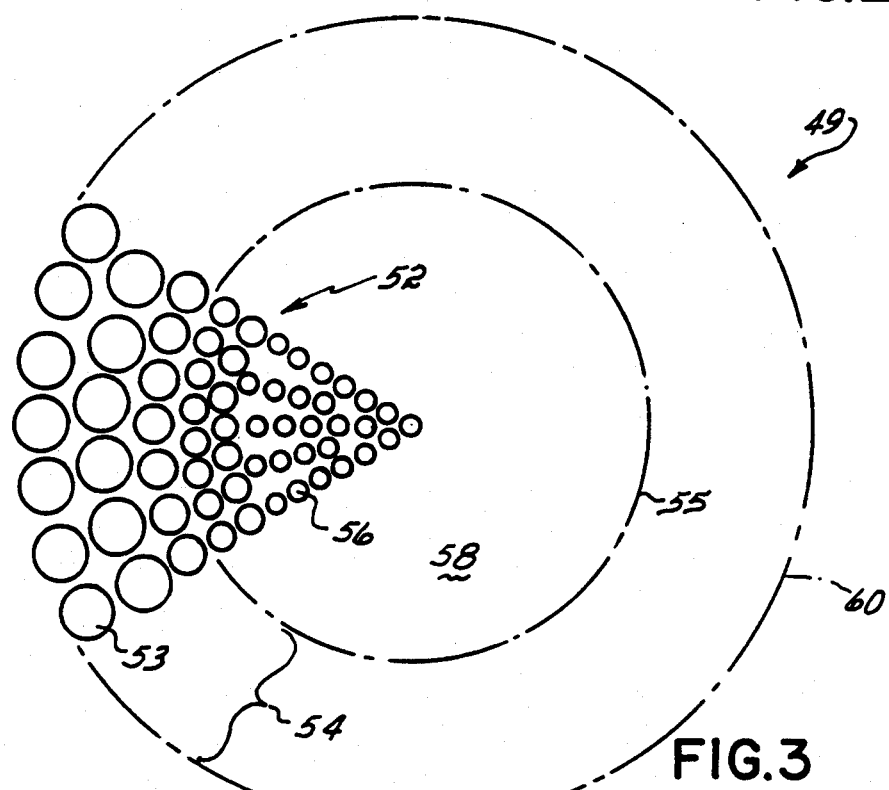
FIG. 3 is a fragmentary top plan view of an embodiment of the stationary aperture plate.

FIG. 3 shows a top view of one embodiment of an aperture plate with apertures having various different aspect ratios in accordance with the principles of the present invention. Plate 49 has a series of circular openings or apertures 52 arranged around the circular plate 49. Preferably, the apertures 52 are arranged concentrically around the plate 49; however, the size and spacing of the apertures may dictate that an arrangement other than concentric be used. This is especially true toward the center of plate 49 where space constraints are higher. Although the apertures 52 of plate 49 are shown to be generally circular in FIG. 3, other shapes may readily be used to accomplish the results of the aperture plate 49 as mentioned above.

To illustrate the operation of plate 49, the plate is divided into two regions according to the size of the apertures 52 as noted by imaginary line 55 and reference numerals 54 and 58. Additionally, other regions might be noted rather than just a center region 58 and a peripheral region 54 surrounding center region 58. As is seen in FIG. 3, the apertures, such as aperture 53 in the peripheral region 54 of plate 49, have larger diameters than the diameters of the apertures, such as aperture 56, located in the center region 58 of aperture plate 49. Plate 49 has a generally uniform thickness throughout so that the apertures 52 are all generally of the same depth. Therefore, the larger diameter peripheral apertures 53 have a lower aspect ratio than the center apertures 56 because the depth to diameter ratio is smaller for the larger diameter apertures 53. The apertures 53 with lower aspect ratios intercept a lower percentage of sputter particles than apertures 56 which have higher aspect ratios because of their smaller diameter, as will be further illustrated below. Therefore, the peripheral apertures 53 allow a greater number of incident sputter particles to pass through plate 49 during a sputter deposition process than do the center apertures 56. This, in turn, causes a relatively higher deposition rate at the periphery of a substrate located below the plate than is achieved at the center area of the substrate.

The deposition rate proximate the center region 58 of plate 49 is also defined by the apertures 56 at the center of the plate 49 and their associated aspect ratios. The apertures 52 of the aperture plate 49 in FIG. 3 are shown to gradually decrease in diameter and thus increase in aspect ratio from the outer peripheral region 54 to the center region 58. When a substrate (not shown in FIG. 3) is placed below plate 49, the deposition rate is gradually reduced from the outer peripheral area of the substrate, which experiences the highest deposition rate because it underlies the peripheral region 54 of plate 49, to the center area of the substrate which underlies plate center area 58. The plate 49 of the present invention, by creating a higher deposition rate at the peripheral area of the substrate, compensates for the often occurring tendency in many sputter deposition chambers and applications to have a higher deposition rate, and hence, a greater film thickness, at the center area of the substrate than at the peripheral edges. Deposition variations and resulting film thickness variations are caused by such factors as plasma density and the shape of the target, as well as the orientation of the substrate with respect to the target. Plate 49 may thus be utilized to achieve a more uniform thickness of the deposition film on a substrate. It may further be used to achieve a thicker film thickness around the periphery of a substrate than at its center if that is a desirable result. It has been empirically found that a deposition rate variance of approximately 10% between the center area and peripheral area of a substrate is all that is necessary to achieve an uniform film thickness in many, but not all cases. However, with the plate of the present invention, any rate variance may be achieved, as is required.

In an alternative embodiment, the aperture plate may be utilized to decrease the deposition rate around the periphery of a substrate while increasing the deposition rate around the center area of the substrate, if so desired. To this end, center apertures 56 would be increased in diameter and peripheral apertures 53 decreased in diameter so that the larger apertures with lower aspect ratios are proximate center region 58 of plate 49 while the smaller apertures are located in peripheral region 54. In other embodiments of the present invention, the diameters and aspect ratios of the apertures 52 of plate 49 may be selectively varied in order to achieve other different deposition rates in selected areas of a substrate. In this way, the aperture plate 49 may be utilized to selectively vary the thickness of the deposited film across the surface of the substrate or to achieve a generally uniform film thickness on the substrate surface.

In plate 49, the larger diameter peripheral apertures, in effect, present a larger amount of open space than plate or blocking space. In accordance with another alternative embodiment of the present aperture plate, the apertures might all be of generally equal cross-sectional and depth dimensions to have generally equal aspect ratios. To selectively vary the deposition rates using such a plate, the density of the apertures would be varied in different regions of the plate. For example, to increase the deposition rate at the peripheral area of the plate relative to the deposition rate at the center area, the apertures in the peripheral area would be positioned closer together than those in the center area. Similarly, various deposition rates may be achieved by selectively varying the density of apertures around the plate.

The peripheral region 54 and center region 58 are not specific and may be redefined by moving imaginary line 55 to define different region boundaries. Further, other regions might be defined on the plate having additional apertures of still different aspect ratios than the center apertures 58 and peripheral apertures 53. Additionally, while the apertures 53, 56 are shown to taper in diameter within the regions moving toward the center of the plate 49, each region might contain apertures of all one aspect ratio unique to that plate region and different from the other plate regions.

As discussed hereinabove, the aspect ratio of the aperture plate is defined as the ratio of the cross-sectional dimension of the aperture, such as diameter, to the depth of the aperture. A high aspect ratio aperture will generally have a longer depth and/or a smaller diameter than a low aspect ratio aperture, which generally has a shorter depth and/or larger diameter. High aspect ratio apertures capture a greater percentage of incident sputter particles than low aspect ratio apertures and thus reduce the sputter deposition rate to a greater extent than low aspect ratio apertures. In an alternative embodiment of the aperture plate of the present invention, the aspect ratios of the apertures are selectively varied by varying the thickness of the plate, i.e., by varying the depth of the apertures instead of varying the diameter of the apertures as shown in FIG. 3.

Figure 4:
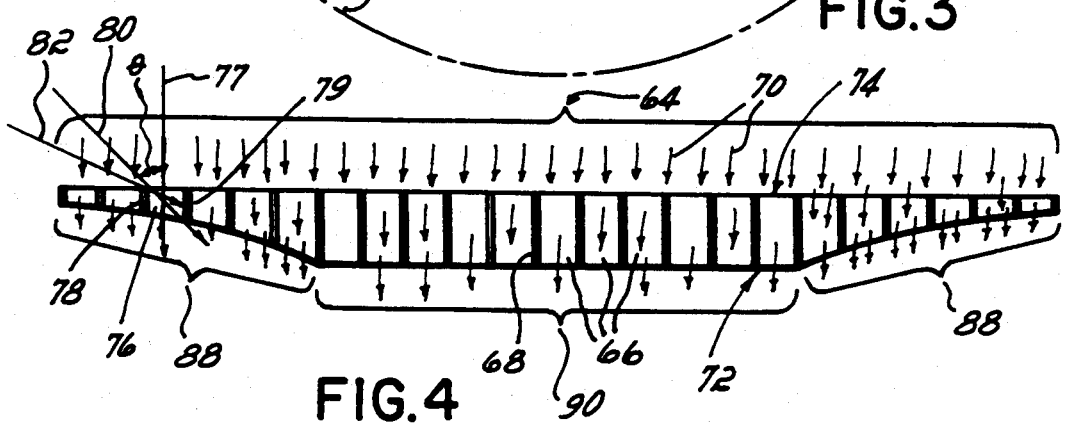
FIG. 4 is a cross-sectional view similar to that of FIG. 2, of an alternative embodiment of the stationary aperture plate of the present invention.

Referring to FIG. 4, stationary aperture plate 64 has a series of apertures 66 therein through which sputtered particles pass to be deposited upon a substrate. In accordance with the principles of the invention, apertures 66 have aperture walls 68 which capture a percentage of the incident sputtered particles such as particles indicated by arrows 70. By capturing a percentage of the incident sputter particles 70, the deposition rate below the bottom plane 72 of plate 64 is lower than the sputter rate above the upper plane 74 of plate 64.

When particles 70 are sputtered from a target, individual particles assume a flight path away from the target. The particle flight path may be characterized by a "flight angle" which is defined herein as the angle $\theta$ of the particle flight with respect to an imaginary line 77 that extends generally parallel to the plane of plate 64. For example, a sputter particle which assumes a flight path that is essentially perpendicular to surface 74 of plate 64 and parallel to line 77, would have a flight angle of approximately 0°, whereas a sputter particle having a flight angle of 45° or 135° with respect to plate surface 74 is assigned a flight angle of 45°. Similarly, a particle having a flight path that is 10° above the horizontal plane of plate 64 is assigned a flight angle of 80°, and so on. Therefore, the flight angle of a sputter particle as defined herein generally falls into the range of 0°–90° with respect to the plate 64. Lower flight angles signify particles which are close to parallel with line 77 and perpendicular to plate 64, while higher flight angles signify particles closer to perpendicular with line 77 and parallel with plate 64.

Each aperture, in turn, has an associated critical angle that is determined by the dimensions of the aperture and is also defined with respect to line 77. The aperture critical angle indicates the maximum flight angle that a sputter particle 70 may assume and still pass through the aperture when it is incident upon the aperture at one of the farthermost ends of the aperture. Particle path 80 and aperture 76 of FIG. 4 illustrate the critical angle of the aperture 76. If a sputter particle has a flight angle greater than the critical angle of the aperture or if it is incident upon the aperture somewhere in the middle of the aperture and has a flight angle close to or equal the critical angle, it will generally strike the walls of the aperture and be collected thereon. For example, particle 82 of FIG. 4 has an angle greater than the critical angle of aperture 64 and strikes the aperture wall. Alternatively, sputter particles with flight angles below the critical angles will pass through the aperture and deposit upon the substrate. The higher the critical flight angle of the aperture, the greater the percentage of particles that will pass through the aperture, because a high critical angle, such as 80°, means that the aperture will allow all particles having an angle below 80° to pass through the aperture, and will intercept only that percentage of particles having angles between 80° and 90°. The critical flight angle of the aperture is determined by the depth and cross-sectional dimensions of the aperture, i.e., by the aspect ratio of the aperture.

In FIG. 4, the angle $\theta$ represents the greatest flight angle that a sputter particle, such as a particle indicated by arrow 80, may have and pass through aperture 76.

Angle $\theta$ is therefore the critical angle of the aperture 76. As may be appreciated, if the walls 79 of aperture 76 were longer (deeper aperture) or the aperture diameter smaller, the critical angle would be smaller, signifying a higher aspect ratio, and a greater percentage of sputter particles would be intercepted. Therefore, the aspect ratio of an aperture is inversely proportional to the critical angle defined by that aperture. A high aspect ratio corresponds to a small critical angle and a greater percentage of blocked particles. A low aspect ratio aperture defines a high critical angle so that a greater percentage of particles pass through the aperture.

For example, a circular aperture with an aspect ratio of 1 has a diameter which is generally equal to the aperture depth and a critical flight angle of 45°. Similarly, an aspect ratio of 1/5 or 0.2 corresponds to a critical flight angle of approximately 79°. The critical flight angle assumes, as discussed above, that the particle is incident upon the aperture at one of the farthermost sides of the aperture. Particle flight path 82 of FIG. 4 shows such a particle incident upon the plate at the farthestmost side of aperture 76.

The flight angle distribution of sputter particles is not generally equally distributed over the range of angles from 0°–90° due to such factors as the shape of the deposition chamber, the relative density and shape of the plasma and the location and shape of the target with respect to the substrate. For example, there may be more particles with a flight angle of 75° than 45° and so forth. Further, each of the sputter particles will not strike an aperture at the farthestmost side of the aperture. As a result, the effective reduction in deposition rate achieved by a plate having apertures of a specific aspect ratio cannot always be predicted simply according to the critical flight angle associated with a particular aspect ratio.

For example, in an empirical test using an aperture plate having an aspect ratio of 1/5 or 0.2, which is spaced from a substrate approximately 2.3 inches and a target which is spaced approximately 4.6 inches from the substrate, applicant measured a rate reduction of approximately 16% from the no-aperture plate deposition rate. For the same plate, target and substrate spacing, a plate using apertures of an aspect ratio equal to 0.5, reduced the reduction rate approximately 46% from the no-plate ratio. Using a plate with apertures of aspect ratio equal to 1, the reduction was as high as 76% for a similar testing setup. This example is merely for illustration and the aperture plate of the present invention will have various different effects for different spacings, different deposition chambers and different target materials. However, the empirical examples illustrates that aspect ratios greater than 1, such as are achieved by commercial collimators, reduce the deposition rate very sharply.

A high reduction of the deposition rate is generally undesirable using the aperture plate of the present invention. With a high reduction rate, the amount of target material wasted on the plate increases, and it takes a longer amount of time to deposit a film of a predetermined thickness on a substrate. This, in turn, reduces the throughput of the deposition chamber. Therefore, the aspect ratios chosen for apertures in the plates 49, 64 of the present invention are generally low, less than 1 and preferably between 0.5 and 0.05, to be substantially non-collimating. A plate having low aspect ratio apertures in that range is generally non-collimating and will not substantially focus the sputter particles into columns of sputter beams to deposit on the substrate. If collimation is desired using plates 49, 64 while selectively varying deposition rates on region of the substrate, then the aspect ratios may be chosen to accomplish the collimation objectives, as long as various different aspect ratio apertures are utilized in accordance with the objectives of the invention. Plates 49, 64 are also preferably spaced sufficiently away from the substrate, such as 0.5 to 1 inch, to substantially prevent any masking of the aperture patterns onto the exposed surface of the substrate.

Referring again to FIG. 4, by varying the aperture depths, and hence, the aspect ratios, the aperture plate 64 may be used to selectively capture different percentages of sputter particles at different regions of the plate in order to achieve the desired deposition rate. In plate 64, the aspect ratio of aperture 76 is chosen so that it generally passes sputter particles which have a flight angle approximately less than or equal to $\theta$. For example, particle 80, incident upon aperture 76, will pass through aperture 76, while particle 82, which is incident upon aperture 76 at the same point as particle 80, has a flight angle greater than the critical angle $\theta$, and will strike wall 79 and be intercepted. As shown in FIG. 4, aperture plate 64 has apertures which are varied in depth rather than diameter in order to achieve the desired deposition rates at chosen areas on a substrate. Specifically, aperture plate 64 has apertures located in the center region 90 with higher aspect ratios than the apertures located in the peripheral region 88. Therefore, a larger percentage of sputter particles 70 are intercepted by the apertures in center region 90 of plate 64 than at peripheral region 88 of the plate because of the higher aspect ratios. Plate 64 thus yields a greater deposition around the peripheral edges of the substrate than in the center area of the substrate, and consequently, a greater film thickness at the periphery of the substrate.

An alternative embodiment of the plate of the present invention may have apertures of greater aspect ratios at the peripheral region 88 than at the center region 90 by providing deeper apertures in the peripheral region 88 and shallower apertures in the center region 90 to increase deposition at the center of a substrate. Since the apertures 66 of plate 64 are generally of equal diameter, the aspect ratios are varied in plate 64 by varying the depth of the apertures such as by varying the corresponding thickness of plate 64. That is, apertures with lower aspect ratios at the peripheral region 88 of plate 64 correspond to a thinner plate in that region than in center region 90.

As may be seen in FIG. 4, the length of one wall of an aperture such as wall 79 of aperture 76 is longer than wall 78 when the apertures are located in the tapered or thinner peripheral area 88 of plate 64. This theoretically results in a different aspect ratio when the sputter particle enters aperture 76 on one side of perpendicular line 77 as opposed to the other side of line 77. However, preferably, the taper of plate 64 at peripheral area 88 or at any area on the plate 64 is such that the effective aspect ratios are approximately equal from one side of the aperture to the other side.

Like plate 30, the varying aspect ratio plates 49, 64 are spaced sufficiently from the substrate so as to be generally non-shadowing. That is, they are preferably maintained at a distance from the substrate of approximately 0.5 to 1 inch or more.

Therefore, by selectively increasing and decreasing the depth of the apertures 66 of plate 64, i.e., by increasing and decreasing the thickness of plate 64 in various regions of the plate, the deposition rate is selectively varied to obtain a more uniform film thickness or a selectively variable film thickness as may be desired. Similarly, the apertures may be varied in diameter or cross-sectional dimension while maintaining a constant depth, as is shown in plate 49 of FIG. 3, to achieve different deposition ratios and selectively varied layer thickness on a substrate. In a still further alternative embodiment, the aspect ratios of the stationary aperture plate of the present invention may be varied by varying both the depth and diameter of the apertures. Further, the density of apertures on the plate might also be varied. Thus, by selectively varying the depth of the apertures, the diameter of the apertures and/or the density of the apertures in different regions of the stationary aperture plate to achieve various, different aspect ratios, the deposition rates and the resulting thickness of the material film deposited upon a substrate are selectively varied to produce a desired result, such as a more uniform film thickness across the surface of the substrate.

While these and other features of the stationary aperture plate of the present invention have been described in accordance with preferred embodiments of the invention, it is to be understood that the invention is not limited thereby, and in light of the present disclosure, various other alternative embodiments will be apparent to one of ordinary skill in the art without departing from the scope of the invention. For example, while the disclosed embodiments of the aperture plate utilize apertures which are dimensioned to yield a greater deposition rate at the periphery of a substrate than at the center, the apertures might be chosen to yield the opposite result or to yield selected various other deposition rates around the various regions of the substrates. Further, while the preferred aperture plate thus disclosed will generally utilize apertures which are dimensioned to have aspect ratios between 0.05 and 0.5, apertures of other aspect ratios might be utilized as well without departing from the scope of the invention, keeping in mind the objectives of the present inventions. Still further, different aperture shapes as well as different plate shapes might be used instead of the circular apertures and circular plates utilized in the preferred embodiments of the invention. Accordingly, applicants intend to be bound only by the following claims.

We claim:

1. A reactive sputter deposition apparatus for reactively depositing a uniform film and reducing the formation of a reactive film layer on the surface of the sputter target including an evacuatable chamber, the apparatus further comprising:

a mount for holding a sputter target within the evacuatable chamber;

an electrical system for electrically biasing the sputter target;

a gas introduction system for introducing an ionizable gas into the chamber proximate to the sputter target;

an ionizing system for ionizing the gas into a plasma containing ionized particles having an electrical charge opposite in polarity to the biased sputter target so that the ionized particles are attracted away from the plasma to bombard the target and sputter particles from the target at a first rate;

a substrate mount for holding a substrate generally opposite the sputter target so that sputtered particles deposit upon a surface of the substrate to form a film;

a reactive gas introduction system for introducing a reactive gas proximate to the substrate surface to chemically react with the sputter particles which deposit upon the substrate surface and thereby form a reaction product film on the substrate surface;

an aperture plate situated between the target and the substrate, the plate having a plurality of apertures with low aspect ratios in the range of 0.05 to 0.5 formed therein so as to be substantially non-collimating, the apertures having associated cross-sectional areas and depth dimensions and configured to intercept a percentage of the sputter particles and to allow other particles to pass through the plate and deposit on the substrate at a second rate which is lower than the first rate by an amount sufficient to allow the reactive deposition reaction to occur at the substrate but not lower by more than approximately 75%, the plate being spaced from said substrate to virtually eliminate any sharp delineation of the aperture pattern onto the substrate surface, the first and second rates being maintained by the plate such that the target is sputtered away at a rate sufficiently high to reduce the formation of a reactive layer on the target, but the deposited particles are deposited upon the substrate at a rate sufficiently low to achieve a desired reaction between the sputter particles and the reactive gas at the substrate surface; and the plate having various regions, and the apertures in one region having aspect ratios different than aspect ratios of apertures in another region to vary the deposition rates between the regions relative to a non-uniform sputtering rate and produce a more uniformly deposited film on the substrate;

whereby a desired uniform film is formed on the substrate while the formation of an undesired reactant film on the target is reduced.

2. The sputter deposition apparatus of claim 1 wherein the plate has a center region and a peripheral region, the apertures in the center region being dimensioned to have greater aspect ratios than the apertures in the peripheral region so as to selectively decrease the deposition rate in a center area of the substrate relative a peripheral area of the substrate.

3. The sputter deposition apparatus of claim 1 wherein the apertures have approximately the same depth dimensions throughout the aperture plate and center region apertures have smaller cross-sectional areas than peripheral region apertures.

4. The sputter deposition apparatus of claim 1 wherein the apertures have approximately the same cross-sectional area throughout the aperture plate and the center region apertures have greater depth dimensions than the peripheral region apertures.

5. The sputter deposition apparatus of claim 1 wherein the plate is spaced from the substrate a distance of at least approximately 0.5 inches.

6. A method for reactively depositing a uniform film on a substrate and reducing the formation of an undesired reactive film of sputter coating material on the surface of an electrically biased sputter target inside a sputter deposition chamber while depositing the film, the method comprising the steps of:

a.) introducing an ionizable gas into a chamber containing an electrically biased target;

b.) ionizing the gas to create a plasma containing ionized particles having an electrical charge opposite in polarity to the biased target so that the ionized particles are attracted away from the plasma to bombard the target surface and sputter particles of the sputter coating material away from the target;

c.) positioning a substrate generally opposite the sputter target so that sputtered target particles deposit upon a surface of the substrate;

d.) introducing a reactive gas proximate to the substrate surface to chemically react with the sputter particles of sputter coating material which deposit upon the substrate surface and thereby form a reactive film on the substrate surface;

e.) sputtering the target at a first rate that is generally higher than a reaction rate of the reactive gas with the sputter coating material at the target surface to reduce the formation of a reactive film on the target surface;

f.) intercepting a percentage of the sputter particles sputtered at the first rate with an aperture plate situated between the target and substrate, the plate including a plurality of apertures with aspect ratios in the range of 0.05 to 0.5 such that the plate is generally non-collimating and affects the first rate such that the sputter particles are deposited on the surface of the substrate at a second rate which is lower than the first rate by an amount sufficient to allow the deposition reaction to occur at the substrate but which is not lower than the first rate by more than approximately 75%, the apertures of one region of the plate having aspect ratios different than aspect ratios of apertures in another region of the plate to vary the deposition rates between the regions relative to a non-uniform sputtering rate and produce a uniform deposited reactive film on the substrate, whereby the target is sputtered away at a first rate sufficiently high to reduce the formation of a film on the target while the deposited particles are deposited upon the substrate at a second rate sufficiently low to achieve the desired reaction between the sputter particles and the reactive gas at the substrate surface and the deposited particles are uniformly distributed for a uniform film.

7. The method of claim 6 wherein the plate has a center region and a peripheral region, the apertures in the center region being dimensioned to have greater aspect ratios than the apertures in the peripheral region so as to selectively decrease the deposition rate in a center area of the substrate relative a peripheral area of the substrate surface.

8. The method of claim 6 further comprising the step of:
(a) positioning the plate to be spaced from the substrate a sufficient distance to virtually eliminate any sharp delineation of the aperture pattern onto the substrate surface.

9. The method of claim 6 further comprising the step of:
(a) positioning the plate spaced from the substrate a distance of at least approximately 0.5 inches.

10. The method of claim 6 wherein the apertures in the one region of the plate have different cross-sectional areas than the apertures in the other region of the plate.

11. The method of claim 6 wherein the apertures in one region of the plate have different depth dimensions than the apertures in the other region of the plate.

* * * * *